United States Patent
Baggett

(10) Patent No.: US 10,714,317 B1
(45) Date of Patent: Jul. 14, 2020

(54) REDUCTION OF CONDENSED GASES ON CHAMBER WALLS VIA HEATED CHAMBER HOUSING FOR SEMICONDUCTOR PROCESSING EQUIPMENT

(71) Applicant: Axcelis Technologies, Inc., Beverly, MA (US)

(72) Inventor: John F. Baggett, Amesbury, MA (US)

(73) Assignee: Axcelis Technologies, Inc., Beverly, MA (US)

(*) Notice: Subject to any disclaimer, the term of this patent is extended or adjusted under 35 U.S.C. 154(b) by 0 days.

(21) Appl. No.: 16/239,995

(22) Filed: Jan. 4, 2019

(51) Int. Cl.
| | |
|---|---|
| *H01J 37/32* | (2006.01) |
| *H01L 21/265* | (2006.01) |
| *H01L 21/67* | (2006.01) |
| *H01J 37/317* | (2006.01) |
| *H01L 21/683* | (2006.01) |

(52) U.S. Cl.
CPC .... *H01J 37/32522* (2013.01); *H01J 37/3171* (2013.01); *H01L 21/265* (2013.01); *H01L 21/67115* (2013.01); *H01L 21/6833* (2013.01)

(58) Field of Classification Search
CPC ......... H01L 21/67103; H01L 21/67109; H01L 23/26; H01J 37/32798; H01J 37/32816; H01J 29/94; H01J 2211/52; H01J 7/183; H01J 7/186; B81C 1/00285; B81C 1/00293
See application file for complete search history.

(56) References Cited

U.S. PATENT DOCUMENTS

| | | | |
|---|---|---|---|
| 5,024,747 A | * | 6/1991 | Turner ............. C23C 14/34 118/725 |
| 5,455,082 A | | 10/1995 | Saito |
| 9,378,992 B2 | | 6/2016 | Huseinovic et al. |
| 9,711,324 B2 | | 7/2017 | Lee |
| 2003/0155000 A1 | | 8/2003 | Nenyei |
| 2005/0183823 A1 | | 8/2005 | Yonekwawa |

(Continued)

OTHER PUBLICATIONS

International Search Report and Written Opinion dated Mar. 30, 2020 in connection with PCT/US2019/064418.

*Primary Examiner* — Brooke Purinton
(74) *Attorney, Agent, or Firm* — Eschweiler & Potashnik, LLC

(57) ABSTRACT

A workpiece processing system has a chamber with one or more chamber walls defining surfaces enclosing a chamber volume. One or more chamber wall heaters selectively heat the chamber walls to a chamber wall temperature. A workpiece support within the chamber selectively supports a workpiece having one or more materials having a respective condensation temperature, above which, the one or more materials are respectively in a gaseous state. A heater apparatus selectively heats the workpiece to a predetermined temperature. A controller heats the workpiece to the predetermined temperature by controlling the heater apparatus, heating the one or more materials to respectively form one or more outgassed materials within the chamber volume. The controller further controls the chamber wall temperature by controlling the chamber wall heaters, where the chamber wall temperature is greater than a condensation temperature of the outgassed materials, preventing condensation of the outgassed material on the chamber surfaces.

20 Claims, 5 Drawing Sheets

(56) References Cited

U.S. PATENT DOCUMENTS

| | | | |
|---|---|---|---|
| 2006/0131514 A1* | 6/2006 | Anc | H01J 37/165 250/492.21 |
| 2010/0025367 A1 | 2/2010 | Wallace | |
| 2018/0061685 A1 | 3/2018 | Ni | |
| 2018/0204742 A1* | 7/2018 | Tateno | H01L 21/67017 |

* cited by examiner

REDUCTION OF CONDENSED GASES ON CHAMBER WALLS VIA HEATED CHAMBER HOUSING FOR SEMICONDUCTOR PROCESSING EQUIPMENT

FIELD

The present disclosure relates generally to workpiece processing systems and methods for processing workpieces, and more specifically to a system, apparatus, and method for reducing condensation of outgas materials in a chamber having a thermal chuck.

BACKGROUND

In semiconductor processing, many operations, such as ion implantation, may be performed on a workpiece or semiconductor wafer. As ion implantation processing technology advances, a variety of ion implantation temperatures at the workpiece can be implemented to achieve various implantation characteristics in the workpiece. For example, in conventional ion implantation processing, three temperature regimes are typically considered: cold implants, where process temperatures at the workpiece are maintained at temperatures below room temperature, hot implants, where process temperatures at the workpiece are maintained at high temperatures typically ranging from 100-600° C., and so-called quasi-room temperature implants, where process temperatures at the workpiece are maintained at temperatures slightly elevated above room temperature, but lower than those used in high temperature implants, with quasi-room temperature implant temperatures typically ranging from 50-100° C.

Hot implants, for example, are becoming more common, whereby the process temperature is typically achieved via a dedicated high temperature electrostatic chuck (ESC), also called a heated chuck. The heated chuck holds or clamps the workpiece to a surface thereof during implantation. A conventional high temperature ESC, for example, comprises a set of heaters embedded under the clamping surface for heating the ESC and workpiece to the process temperature (e.g., 100° C.-600° C.), whereby a gas interface conventionally provides a thermal interface from the clamping surface to the backside of the workpiece. Typically, a high temperature ESC is cooled through radiation of energy to the chamber surfaces in the background.

SUMMARY

The present disclosure overcomes limitations of the prior art by providing a system, apparatus, and method for mitigating condensation of outgas materials associated with heating of a workpiece in a chamber. Various aspects of the present disclosure provide advantages over conventional systems and methods, with particular advantages being provided in heated ion implantation systems utilizing a thermal chuck. Accordingly, the following presents a simplified summary of the disclosure in order to provide a basic understanding of some aspects of the disclosure. This summary is not an extensive overview of the disclosure. It is intended to neither identify key or critical elements of the invention nor delineate the scope of the invention. Its purpose is to present some concepts of the disclosure in a simplified form as a prelude to the more detailed description that is presented later.

In accordance with one exemplary aspect of the disclosure, a workpiece processing system is provided having a chamber having one or more chamber walls defining a respective one or more surfaces generally enclosing a chamber volume. One or more chamber wall heaters are associated with the one or more chamber walls. The one or more chamber wall heaters, for example, are configured to selectively heat the one or more chamber walls to a chamber wall temperature. In one example, the one or more chamber wall heaters comprise one or more of a heat lamp, an infrared heater, and a resistive heater.

A workpiece support, for example, is positioned within the chamber and configured to selectively support a workpiece having one or more materials residing thereon. Each of the one or more materials, for example, has a respective condensation temperature associated therewith, above which, the one or more materials are respectively in a gaseous state. A heater apparatus, for example, is further provided and configured to selectively heat the workpiece to a predetermined temperature. The heater apparatus may comprise one or more of a heat lamp, an infrared heater, and a resistive heater.

According to the present disclosure, a controller is further provided and configured to heat the workpiece to the predetermined temperature via a control of the heater apparatus. Accordingly, the one or more materials are heated to respectively form one or more outgassed materials within the chamber volume. The controller, for example, is further configured to control the chamber wall temperature via a control of the one or more chamber wall heaters, wherein the chamber wall temperature is greater than a condensation temperature associated with the one or more outgassed materials. As such, a condensation of the outgassed material is generally prevented on the one or more chamber surfaces. According to one example, the chamber wall temperature is determined based on an outgassing curve associated with the one or more predetermined materials.

According to another example, the system further comprises a first loadlock valve operably coupled to the chamber and configured to provide selective fluid communication between the chamber volume and a first environment. The first loadlock valve, for example, is further configured to selectively pass the workpiece between the chamber volume and the first environment. A second loadlock valve may be further operably coupled to the chamber and configured to provide selective fluid communication between the chamber volume and a second environment. The second loadlock valve, for example, is further configured to selectively pass the workpiece between the chamber volume and second environment.

In one example, the controller is further configured to selectively open and close the first loadlock valve, thereby selectively isolating the chamber volume from the first environment. The controller may be further configured to selectively open and close the second loadlock valve, thereby selectively isolating the chamber volume from the second environment.

In another exemplary aspect, the chamber comprises a vacuum port and a purge gas port in fluid communication with the chamber volume. For example, the workpiece processing system further comprises a vacuum source and a vacuum valve that is configured to provide selective fluid communication between the vacuum source and the vacuum port. A purge gas source having a purge gas associated therewith and a purge gas valve configured to provide selective fluid communication between the purge gas source and the purge gas port, wherein the vacuum valve and purge gas valve are configured to selectively flow the purge gas from the purge gas port to the vacuum port. The controller, for example, may be further configured to control the vacuum valve and purge gas valve to selectively flow the purge gas from the purge gas port to the vacuum port at a predetermined pressure concurrent with heating of the workpiece. As such, the outgassed material may be generally evacuated from the chamber volume, whereby a condensation of the outgassed material is generally prevented on the one or more chamber surfaces.

In one example, the first environment comprises an atmospheric environment at atmospheric pressure, and the second environment comprises a vacuum environment at a vacuum pressure. The controller, for example, may be thus configured to flow the purge gas from the purge gas port to the vacuum port concurrent with the second loadlock valve isolating the chamber volume from the second environment. In another example, the controller may be configured to flow the purge gas from the purge gas port to the vacuum port concurrent with the second loadlock valve isolating the chamber volume from the second environment and the first loadlock valve isolating the chamber volume from the first environment. The controller, for example, may be further configured to open the purge gas valve and vacuum valve concurrent with the heating of the workpiece, thereby further concurrently flowing the purge gas from the purge gas port to the vacuum port at the predetermined pressure.

In accordance with another example, the purge gas valve may comprise a purge gas regulator. The vacuum valve may further comprise a vacuum regulator, wherein the purge gas regulator and vacuum regulator are configured to provide the predetermined pressure when the purge gas is flowed from the purge gas port to the vacuum port. The controller, for example, may be further configured to control one or more of the purge gas regulator and vacuum regulator, thereby controlling the predetermined pressure. In another example, one or more of the purge gas regulator and vacuum regulator comprise manual regulators.

According to yet another example, a temperature measurement apparatus is further configured to determine a measured temperature of the workpiece. As such, the controller may be further configured to control the one or more chamber wall heaters based, at least in part, on the measured temperature of the workpiece.

In still another example, the workpiece support may comprise a heated platen having a support surface configured to contact a backside of the workpiece. The heated platen, for example, may generally define the heater apparatus. In another example, the workpiece support may comprise one or more pins configured to selectively raise and lower the workpiece onto a support surface associated therewith.

In accordance with yet another exemplary aspect of the disclosure, a loadlock apparatus is provided having a chamber with one or more chamber walls defining a respective one or more surfaces generally enclosing a chamber volume. The chamber, for example, comprises a vacuum port and a purge gas port, wherein the vacuum port is in fluid communication with the chamber volume and the vacuum valve, and wherein the purge gas port is in fluid communication with chamber volume and the purge gas valve. The vacuum port and purge gas port, for example, are generally oppose one another.

One or more chamber wall heaters, for example, are associated with the one or more chamber walls, wherein the one or more chamber wall heaters are configured to selectively heat the one or more chamber walls to a chamber wall temperature. A workpiece support, for example, is positioned within the chamber and configured to selectively support a workpiece having one or more materials residing thereon. Each of the one or more materials, for example, has a respective condensation temperature associated therewith, above which, the one or more materials are respectively in a gaseous state.

A heated platen may be further associated with the workpiece support, wherein the heated platen is configured to selectively heat the workpiece to a predetermined temperature wherein the heated platen is positioned between the vacuum port and purge gas port. A controller may be further provided and configured to heat the workpiece to the predetermined temperature via a control of the heater apparatus, thereby heating the one or more materials to respectively form one or more outgassed materials within the chamber volume/The controller, for example, is further configured to control the chamber wall temperature via a control of the one or more chamber wall heaters, wherein the chamber wall temperature is greater than a condensation temperature associated with the one or more outgassed materials, thereby preventing a condensation of the outgassed material on the one or more chamber surfaces. The controller may be further configured to selectively flow of the purge gas passed across the heated platen.

According to still another exemplary aspect of the disclosure, a method for mitigating condensation of outgassing of a workpiece is provided. The method comprises heating the workpiece in a chamber having one or more chamber surfaces generally defining a chamber volume, thereby generating an outgassed material. The method further comprises heating the one or more chamber surfaces to a predetermined pressure concurrent with the heating of the workpiece, wherein the predetermined pressure generally prevents the outgassed material from condensing on the one or more chamber surfaces. In one example, heating the one or more chamber surfaces comprises selectively activating one or more chamber wall heaters associated with the one or more chamber surfaces.

The above summary is merely intended to give a brief overview of some features of some embodiments of the present disclosure, and other embodiments may comprise additional and/or different features than the ones mentioned above. In particular, this summary is not to be construed to be limiting the scope of the present application. Thus, to the accomplishment of the foregoing and related ends, the disclosure comprises the features hereinafter described and particularly pointed out in the claims. The following description and the annexed drawings set forth in detail certain illustrative embodiments of the disclosure. These embodiments are indicative, however, of a few of the various ways in which the principles of the disclosure may be employed. Other objects, advantages and novel features of the disclosure will become apparent from the following detailed description of the disclosure when considered in conjunction with the drawings.

DETAILED DESCRIPTION

Figure 1:
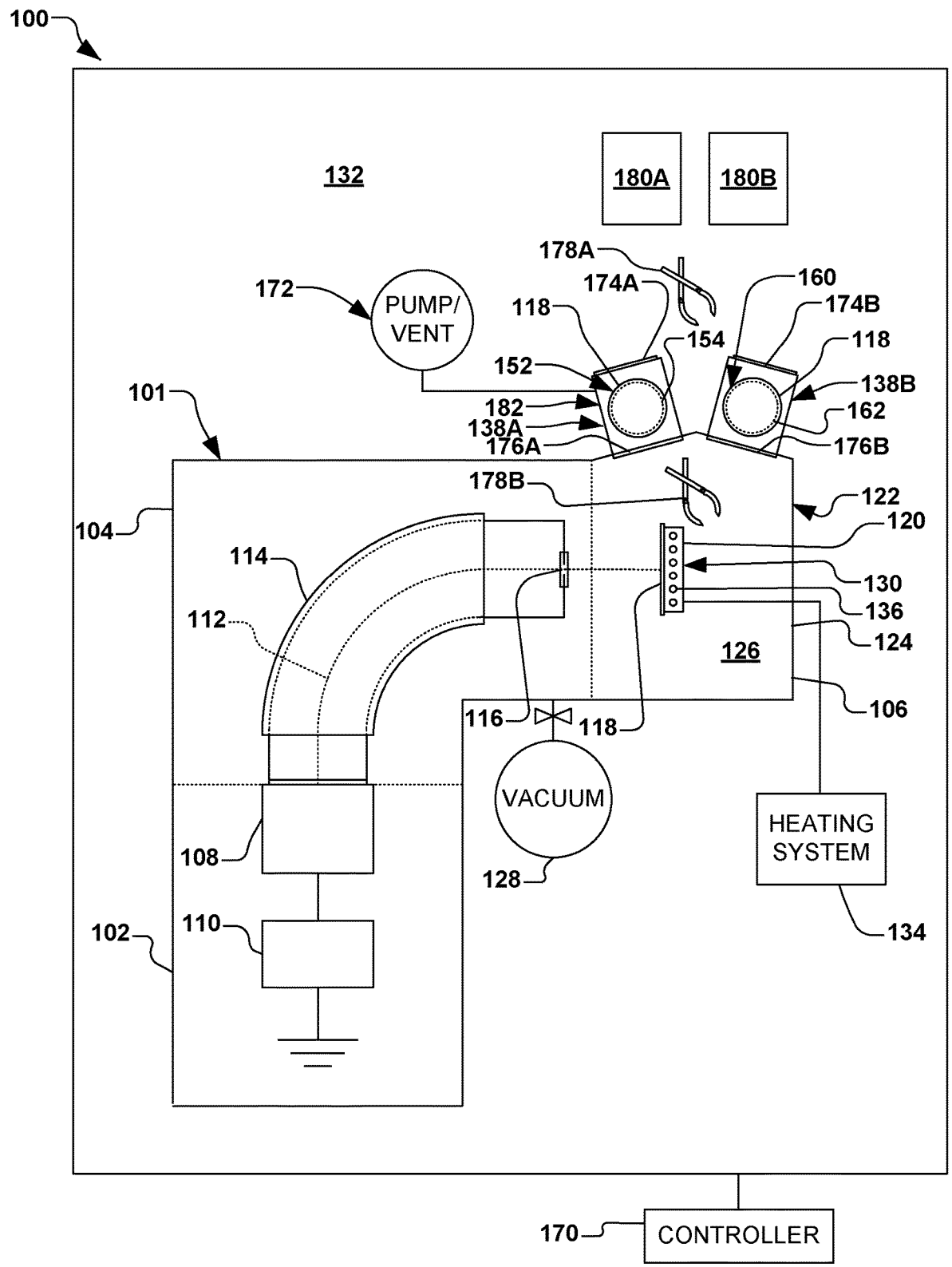
FIG. 1 illustrates a block diagram of an exemplary heated ion implantation system in accordance with an aspect of the present disclosure.

The present disclosure is directed generally toward semiconductor processing systems and methods, and more particularly, to a chamber for an ion implantation system, wherein the chamber is configured to control a temperature of a workpiece. The chamber, for example, comprises a loadlock chamber configured to mitigate condensation of outgassed materials from the workpiece associated with heating of the workpiece.

Accordingly, the present disclosure will now be described with reference to the drawings, wherein like reference numerals may be used to refer to like elements throughout. It should be understood that the description of these aspects are merely illustrative and that they should not be interpreted in a limiting sense. In the following description, for purposes of explanation, numerous specific details are set forth in order to provide a thorough understanding of the present disclosure. It will be evident to one skilled in the art, however, that the present disclosure may be practiced without these specific details.

Heated ion implantation processes can heat a workpiece to process temperatures in the range of 100° C.-600° C. or higher. The process temperature, for example, may be achieved and maintained at an electrostatic chuck that supports the workpiece during implantation. In accordance with various aspects of the present disclosure, FIG. 1 illustrates an exemplary ion implantation system 100. The ion implantation system 100 in the present example comprises an exemplary ion implantation apparatus 101, however various other types of vacuum-based semiconductor processing systems are also contemplated, such as plasma processing systems, or other semiconductor processing systems. The ion implantation apparatus 101, for example, comprises a terminal 102, a beamline assembly 104, and an end station 106.

Generally speaking, an ion source 108 in the terminal 102 is coupled to a power supply 110 to ionize a dopant gas into a plurality of ions and to form an ion beam 112. The ion beam 112 in the present example is directed through a mass analysis apparatus 114, and out an aperture 116 towards the end station 106. In the end station 106, the ion beam 112 bombards a workpiece 118 (e.g., a substrate such as a silicon wafer, a display panel, etc.), which is selectively clamped or mounted to a thermal chuck 120. The thermal chuck 120, for example, may comprise an electrostatic chuck (ESC) or mechanical clamp chuck, wherein the thermal chuck is configured to selectively control a temperature of the workpiece 118. Once embedded into the lattice of the workpiece 118, the implanted ions change the physical and/or chemical properties of the workpiece. Because of this, ion implantation is used in semiconductor device fabrication and in metal finishing, as well as various applications in materials science research.

The ion beam 112 of the present disclosure can take any form, such as a pencil or spot beam, a ribbon beam, a scanned beam, or any other form in which ions are directed toward end station 106, and all such forms are contemplated as falling within the scope of the disclosure.

According to one exemplary aspect, the end station 106 comprises a process chamber 122, such as a vacuum chamber 124, wherein a process environment 126 is associated with the process chamber. The process environment 126 generally exists within the process chamber 122, and in one example, comprises a vacuum produced by a vacuum source 128 (e.g., a vacuum pump) coupled to the process chamber and configured to substantially evacuate the process chamber.

In one example, the ion implantation apparatus 101 is configured to provide a high temperature ion implantation, wherein the workpiece 118 is heated to a process temperature (e.g., approximately 100-600° C. or greater). Thus, in the present example, the thermal chuck 120 comprises a heated chuck 130, wherein the heated chuck is configured to support and retain the workpiece 118 while further heating the workpiece 118 within the process chamber 122 prior to, during, and/or after the exposure of the workpiece to the ion beam 112.

The heated chuck 130, for example, comprises an electrostatic chuck (ESC) configured to heat the workpiece 118 to a processing temperature that is considerably greater than an ambient or atmospheric temperature of the surroundings or external environment 132 (e.g., also called an "atmospheric environment"). A heating system 134 may be further provided, wherein the heating system is configured to heat the heated chuck 130 and, in turn, the workpiece 118 residing thereon to the desired processing temperature. The heating system 134, for example, is configured to selectively heat the workpiece 118 via one or more heaters 136 disposed within the heated chuck 130. In one alternative, the heating system 134 comprises a radiant heat source, such as one or more a halogen lamp, light emitting diode, and infrared thermal device configured to selectively heat the workpiece.

For some high temperature implants, the workpiece 118 may allowed to "soak" on the heated chuck 130 within the vacuum of the process environment 126 until the desired temperature is reached. Alternatively, in order to increase cycle time through the ion implantation system 100 the workpiece 118 may be pre-heated in one or more chambers 138A, 138B (e.g., one or more load lock chambers) operatively coupled to the process chamber 122.

Depending on the tool architecture, process, and desired throughput, or other factors, the workpiece 118 may be preheated to a first temperature via a pre-heat apparatus 152 disposed within the chamber 138A, for example. In one example, the first temperature is equal to or lower than the process temperature, thus allowing for a final thermal equalization on the heated chuck 130 inside the vacuum chamber 124. Such a scenario allows the workpiece 118 to lose some heat during transfer to the process chamber 122, wherein final heating to the process temperature is performed on the heated chuck 130. Alternatively, the workpiece 118 may be preheated via the pre-heat apparatus 152 to the first temperature, wherein the first temperature is higher than the process temperature. Accordingly, the first temperature could be optimized such that cooling of the workpiece 118 during transfer to the process chamber 122 allows for the workpiece to be at the desired process temperature as it is clamped onto the heated chuck 130.

In order to accurately control and/or accelerate the thermal response and enable an additional mechanism for heat transfer, the back side of the workpiece 118 is brought into conductive communication with the heated chuck 130. This conductive communication is achieved through a pressure controlled gas interface (also called "back side gas") between the heated chuck 130 and the workpiece 118. Pressure of the back side gas, for example, is generally limited by the electrostatic force of the heated chuck 130, and can be generally kept in the range of 5-20 Torr. In one example, the back side gas interface thickness (e.g., the distance between the workpiece 118 and the heated chuck 130) is controlled on the order of microns (typically 5-20 µm), and as such, the molecular mean free path in this pressure regime becomes large enough for the interface thickness to push the system into the transitional and molecular gas regime.

In accordance with another aspect of the disclosure, chamber 138B comprises a cooling apparatus 160 configured to cool the workpiece when the workpiece 118 is disposed within the chamber 138B subsequent to being implanted with ions during ion implantation. The cooling apparatus 160, for example, may comprise a chilled workpiece support 162, wherein the chilled workpiece support is configured to actively cool the workpiece 118 residing thereon via thermal conduction. The chilled workpiece support 162, for example, comprises a cold plate having a one or more cooling channels passing therethrough, wherein a cooling fluid passing through the cooling channel substantially cools the workpiece 118 residing on a surface of the cold plate. The chilled workpiece support 162 may comprise other cooling mechanisms, such as Peltier coolers or other cooling mechanisms known to one of ordinary skill.

In accordance with another exemplary aspect, a controller 170 is further provided and configured to selectively activate one or more of the heating system 134, the pre-heat apparatus 152, and the cooling apparatus to selectively heat or cool the workpiece 118 respectively residing thereon. The controller 170, for example, may be configured to heat the workpiece 118 in chamber 138A via the pre-heat apparatus 152, to heat the workpiece to a predetermined temperature in the processing chamber 122 via the heated chuck 130 and heating system 134, to implant ions into the workpiece via the ion implantation apparatus 101, to cool the workpiece in chamber 138B via the cooling apparatus 160, and to selectively transfer the workpiece between the atmospheric environment 132 and the process environment 126 via control of a pump and vent 172, the respective atmospheric doors 174A, 174B and vacuum doors 176A, 176B of the respective chambers 138A, 138B, and workpiece transfer apparatus 178A, 178B.

In one example, the workpiece 118 may be further delivered to and from the process chamber 122 such that the workpiece is transferred between a selected front opening unified pod (FOUP) 180A, 180B and chambers 138A, 138B via workpiece transfer apparatus 178A, and further transferred between the chambers 138A, 138B and the heated chuck 130 via workpiece transfer apparatus 178B. The controller 170, for example, is further configured to selectively transfer the workpiece between the FOUPs 180A, 180B, chambers 138A, 138B, and heated chuck 130 via a control of the workpiece transfer apparatus 178A, 178B.

The present disclosure appreciates that, prior to be delivered to the process chamber 122, the workpiece 118 may have undergone previous processing, whereby the workpiece may comprise one or more materials (e.g., photoresist layers or other materials) that may have been deposited or otherwise formed on the workpiece. During heating of the workpiece 118 by the pre-heat apparatus 152 in the chamber 138A, for example, outgassing may occur, whereby the materials formed, deposited, or otherwise residing on the workpiece may transform from a solid state to various gases. Absent countermeasures provided in the present disclosure, such gases can have a propensity to condense and build up on chamber walls 182 and/or other components within the chamber 138A that may be substantially cooler than the first temperature of the workpiece 118. Again, absent countermeasures, such a buildup of condensed material can result in costly production downtime, product contamination and elevated particle levels.

For most materials, such as materials that may be formed on the workpiece 118, higher temperatures can lead to greater degrees of outgassing. Each material, for example, can have a respective vapor vs. temperature curve associated therewith, whereby an amount of outgassing (defining an outgassed material) increases as the material increases in temperature. When the outgassed material comes into contact with a surface that is relatively cooler, the outgassed material will tend to condense on the surface when the temperature of the surface falls below the vapor vs. temperature curve, thus returning to a solid state on the surface.

When such heating of the workpiece 118 occurs within an enclosure, such as in the preheat station 152 within the chamber 138A, outgassed material is generally dispersed within the enclosed chamber. In a conventional enclosure, for example, the outgassed materials can condense on one or more surfaces (e.g., an aluminum wall of the enclosure at room temperature) and can lead to a build-up or coating of the material on the surfaces of the enclosure. As more material condenses, the coating of material tend to build, whereby subsequent flaking or peeling of the material from the surfaces can lead to particle contamination on workpieces, or elsewhere in the system. As a result, frequent preventive maintenance, such as scraping or other cleaning of the walls of the enclosure, can lead to lost productivity and/or costly and difficult cleaning procedures.

Figure 2:
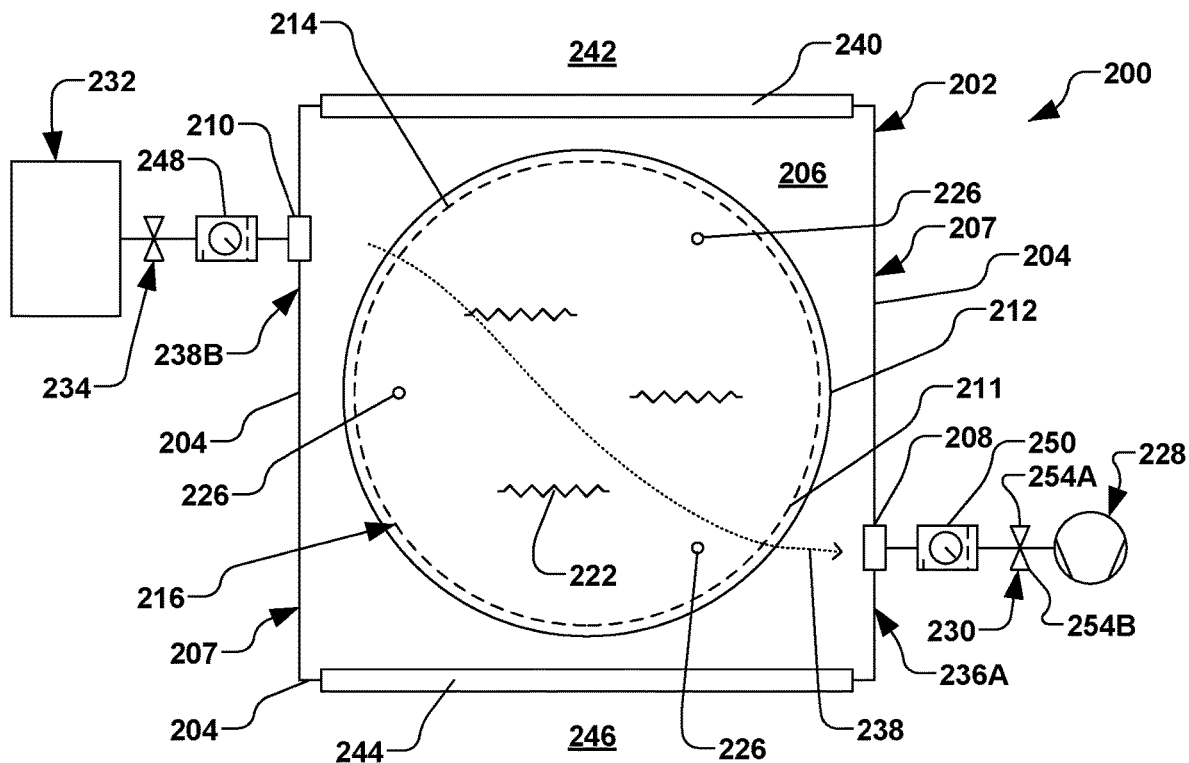
FIG. 2 is a schematic representation of an exemplary chamber in accordance with an aspect of the present disclosure.

The present disclosure contemplates a general prevention or mitigation of the material from condensing on the chamber walls 182, thereby decreasing the frequency of preventive maintenance, and increasing productivity of the system 100. As illustrated in FIG. 2, for example, a loadlock apparatus 200 is provided, wherein a chamber 202, such as the chamber 138A of FIG. 1, is provided. The chamber 202 of FIG. 2, for example, has one or more surfaces 204 generally enclosing a chamber volume 206. For example, the one or more surfaces 204 are defined by one or more chamber walls 207 generally enclosing the chamber volume 206. The chamber 202, for example, comprises a vacuum port 208 and a purge gas port 210, wherein the vacuum port and purge gas port are in fluid communication with the chamber volume 206.

Figure 3:
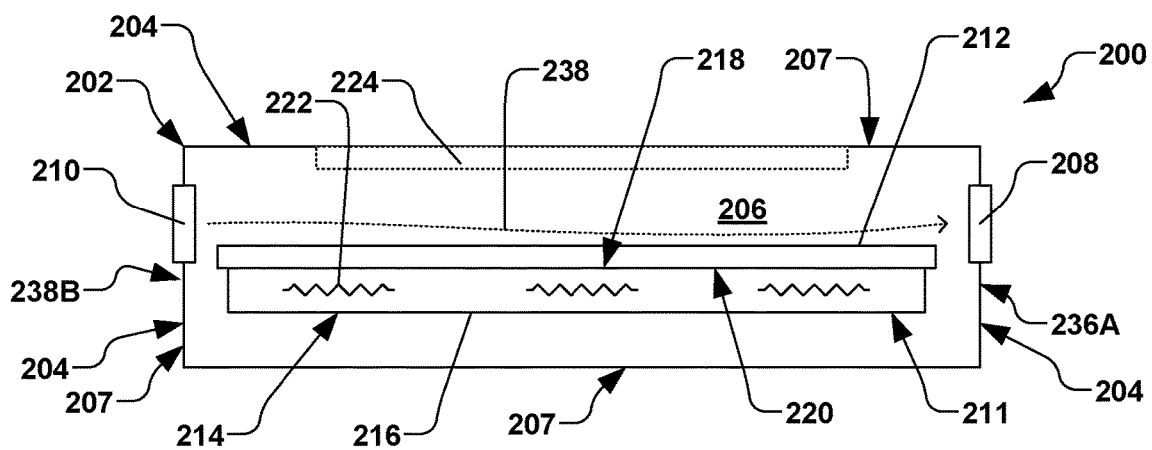
FIG. 3 is a simplified side view of a chamber in accordance with an aspect of the present disclosure.

According to one example, a workpiece support 211 is positioned within the chamber 200 and configured to selectively support a workpiece 212 within the chamber. A heater apparatus 214, for example, is further provided and configured to selectively heat the workpiece 212 to a predetermined temperature. In one example, the workpiece support 211 comprises a heated platen 216 having a support surface 218 configured to contact a backside 220 of the workpiece 212, as illustrated in FIG. 3. In one example, the heated platen 216 generally defines the heater apparatus 214. For example, the heater apparatus 214 may comprise one or more resistive heater elements 222 embedded within the heated platen 216, wherein the one or more resistive heater elements are configured to selectively heat the workpiece 212 via conduction through the heated platen. In other examples, the heater apparatus 214 may alternatively, or additionally comprise one or more radiative elements 224, such as a heat lamp, an infrared heater, or other heater element(s). It should be noted that, in some examples, the one or more radiative elements 224 may be omitted, whereby the heated platen 216 is the sole heater apparatus 214. In another example, the workpiece support 211 may comprise one or more pins 226, as illustrated in FIG. 2, whereby the one or more pins are configured to selectively raise and lower the workpiece 212 onto the support surface 218.

In accordance with the present disclosure, it is appreciated that heating the workpiece 212 may generate an outgassed material within the chamber volume 206, as described above. According, the present disclosure advantageously provides a vacuum source 228 (e.g., a vacuum pump), wherein a vacuum valve 230 is configured to provide selective fluid communication between the vacuum source and the vacuum port 208. Further, a purge gas source 232 having a purge gas (e.g., an inert gas such as nitrogen) is further provided, whereby a purge gas valve 234 is configured to provide selective fluid communication between the purge gas source and the purge gas port 210.

In accordance with one example, the controller (e.g., the controller 170 of FIG. 1) is further configured to control the vacuum valve 230 and purge gas valve 234 to selectively flow the purge gas from the purge gas port 210 to the vacuum port 208 at a predetermined pressure concurrent with heating of the workpiece 212 by the heater apparatus 214. Accordingly, outgassed material associated with the heating of the workpiece 212 may be advantageously evacuated from the chamber volume 206, thus generally preventing or otherwise mitigating a condensation of the outgassed material on the one or more chamber surfaces 204. Preferably, the vacuum port 208 and purge gas port 210 are generally positioned opposite one another with respect to the chamber 202, such as being positioned on opposing chamber walls 236A, 236B, whereby a flow (shown by arrow 238) generally passes over the workpiece 212, thus advantageously evacuating outgassed materials through the vacuum port 208.

In one example, the chamber 202 is generally evacuated by the vacuum source 228 while the purge gas is concurrently introduced into the chamber from the purge gas source 232 wherein the predetermined pressure is advantageously maintained within the chamber volume 206. For example, the predetermined pressure is approximately atmospheric pressure, whereby an advantageous heat transfer can be achieved for pre-heating of the workpiece 212, thus providing adequate throughput of workpieces. Further, the introduction of the purge gas concurrent with the evacuation of the chamber 202 generally dilutes and substantially evacuates outgassed material from the chamber volume 206, thus generally preventing condensation and/or build-up of the outgassed material on the one or more chamber surfaces 204.

According to another example, as illustrated in FIG. 2, the chamber 202 comprises a first loadlock valve 240 operably coupled to the chamber and configured to provide selective fluid communication between the chamber volume 206 and a first environment 242, such as the atmospheric environment 132 of FIG. 1. The first loadlock valve 240 of FIG. 2, for example, is further configured to selectively pass the workpiece 212 between the chamber volume 206 and the first environment 242, as discussed above. A second loadlock valve 244, for example, is further operably coupled to the chamber 202 and configured to provide selective fluid communication between the chamber volume 206 and a second environment 246 (e.g., a vacuum environment such as the process environment 126 of FIG. 1). The second loadlock valve 244 of FIG. 2, for example, is further configured to selectively pass the workpiece 212 between the chamber volume 206 and second environment 246.

The controller 170 of FIG. 1, for example, is further configured to selectively open and close the first loadlock valve 240 of FIG. 2, thereby selectively isolating the chamber volume 206 from the first environment 242. In a further example, the controller 170 of FIG. 1 is further configured to selectively open and close the second loadlock valve 244, thereby selectively isolating the chamber volume 206 from the second environment 246. The controller 170 of FIG. 1, for example, may be further configured to flow the purge gas from the purge gas port 210 of FIG. 2 to the vacuum port 208 concurrent with one or more of the second loadlock valve 244 isolating the chamber volume 206 from the second environment 246 and the first loadlock valve 240 isolating the chamber volume from the first environment 242. The controller 170 of FIG. 1 may be further configured open the purge gas valve 234 and vacuum valve 230 of FIG. 2 concurrent with the heating of the workpiece 212 by the heater apparatus 214, thereby further concurrently flowing the purge gas from the purge gas port 210 to the vacuum port 208 at the predetermined pressure.

In accordance with another example, the purge gas valve 234 may further comprise a purge gas regulator 248. Additionally, or optionally, the vacuum valve 230 may further comprise a vacuum regulator 250. As such, the purge gas regulator 248 and vacuum regulator 250, for example, may be configured to provide the predetermined pressure when the purge gas is flowed from the purge gas port 210 to the vacuum port 208. In accordance with another example, the controller 170 of FIG. 1 may be further configured to control one or more of the purge gas regulator 248 and vacuum regulator 250 of FIG. 2, thereby controlling the predetermined pressure. Alternatively, one or more of the purge gas regulator 248 and vacuum regulator 250 may comprise manual regulators, whereby the pressure associated therewith may be manually controlled.

In accordance with yet another example, a temperature measurement apparatus 252 may be provided and configured to determine or define a measured temperature of the workpiece 212. Accordingly, the controller 170 of FIG. 1 may be further configured to control the vacuum valve 230 and purge gas valve 234 of FIG. 2 based, at least in part, on the measured temperature of the workpiece 212. In one example, a workpiece 212 that is initially at room temperature is placed in the chamber 202, whereby the workpiece is heated within the chamber until the measured temperature matches a desired preheat temperature.

In yet another example, the controller 170 of FIG. 1 is further configured to control the vacuum valve 230 and purge gas valve 234 based, at least in part, on a predetermined time, such as a "soak time", during which the workpiece 212 is heated by the heater apparatus 214.

Accordingly, the present disclosure advantageously provides an efficient solution to minimizing condensation of outgassed material associated with the heating of the workpiece 212. For example, during the predetermined time (e.g., 10 seconds), the workpiece 212 is heated and the outgassing gases are generally diluted with the purge gas and evacuated from the chamber 202 via a vacuum pressure provided by the vacuum source 228 (e.g., a rough pump). The present disclosure, for example, contemplates the flow 238 of the purge gas from the purge gas source 232 being balanced with the vacuum pressure provided by the vacuum source 228. Two vacuum regimes, for example, may be further provided by the vacuum source 228, whereby a fast vacuum and slow vacuum may be attained.

For example, a slow (rough) vacuum may be provided by the vacuum source 228, whereby the slow vacuum is configured to balance (e.g., generally equalize) a purge gas pressure associated with the purge gas source 232 and the vacuum pressure associated with the vacuum source 228. For example, the purge gas regulator 248 may be controlled to maintain a generally constant pressure (e.g., atmospheric pressure) within the chamber 202.

In one example, the purge gas pressure is approximately 37.5 psi to maintain approximately atmospheric pressure (e.g., approximately 750-760 Torr) within the chamber 202. Accordingly, a slow rough valve 254A associated with the vacuum valve 230 is opened to remove gaseous material from the chamber 202, thus balancing the pressure and generally preventing condensation of the outgas material on the one or more chamber surfaces 204. In another example, the workpiece 212 is placed on the pins 226, whereby the pins lower the workpiece onto the heated platen 216 of the preheat station 152 of FIG. 1. As the pins 226 of FIG. 2 are lowered, the slow rough valve 254A associated with the vacuum valve 230 and purge gas valve 234 are opened. Accordingly, as the workpiece 212 is heated to the predetermined temperature, the flow 238 of purge gas and evacuation of the chamber volume 206 occurs.

When the workpiece 212 reaches the predetermined temperature, the workpiece is ready to be transferred from the chamber 202 to the process chamber 122 of FIG. 1. Since the process environment 126 associated with the process chamber 122 is generally a vacuum environment, in order to transfer the workpiece 118 to the process chamber, a fast rough valve 254B associated with vacuum valve 230 the opened, thus evacuating the chamber 202 to a vacuum pressure (e.g., approximately 10 Torr). Since the workpiece 212 is already at the predetermined temperature, a low heat transfer rate associated with the vacuum pressure is generally not a concern. Once at the vacuum pressure is achieved, the second loadlock valve 244 is opened to expose the workpiece 212 to the vacuum environment 246, and the workpiece is ready to be transferred into the process chamber 122 of FIG. 1, whereby the pins 226 of FIG. 2 are raised to lift the workpiece off the heated platen 216 and the workpiece transfer robot 178B of FIG. 1 retrieves the workpiece and transfers the workpiece to the ESC 130.

Thus, in one example, the vacuum pump 228 of FIG. 2 generally evacuates the chamber 202 for the substantially the entirety of the heating of the workpiece 212, such as during heating in the preheat station 152 of FIG. 1. The present disclosure contemplates introducing the purge gas at various pressure levels, such as during or concurrent with a portion of the time during which the workpiece 212 is heated.

For example, in order to rough down the pressure to reach the vacuum environment in 4-6 seconds, the rough vacuum is maintained, whereby the vacuum pump 228 is generally running the whole time when workpiece is in the loadlock chamber. The timing of inert gas purge, for example, may be concurrent with the rough vacuum. The present disclosure maintains the vacuum valve 230 (e.g., rough pump valve) in an open position during both the pre-heat and rough-down times, thus generally evacuating outgassed material from the chamber 202, while maintaining the predetermined pressure for advantageous heating of the workpiece 212 via the concurrent introduction of the purge gas.

Once the workpiece is removed from the chamber 202 and placed in the process chamber, the isolation valve is closed, the rough pump valve is closed, and the loadlock chamber is vented (e.g., via either opening the purge gas valve or other venting to atmosphere) to bring the pressure within the loadlock pressure back up to atmospheric pressure to await another workpiece.

Figure 4:
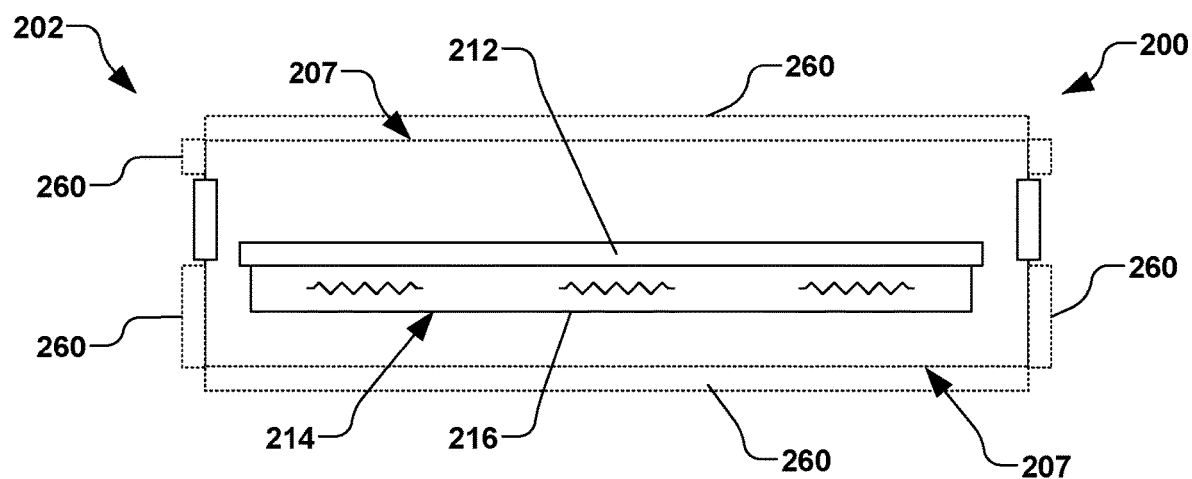
FIG. 4 is a simplified side view of a chamber having heated walls in accordance with an aspect of the present disclosure.

In accordance with yet another exemplary aspect, one or more of the chamber walls 207 may heated to a predetermined chamber wall temperature by one or more chamber wall heaters 260 shown in FIG. 4, whereby the predetermined chamber wall temperature is determined based on the outgassing curve of one or more predetermined materials associated with the workpiece 212. The one or more chamber wall heaters 260, for example, comprise one or more of a heat lamp, an infrared heater, and a resistive heater configured to selectively heat the one or more chamber surfaces 204. In one example, the one or more chamber wall heaters 260 comprise one or more resistive heaters integrated with the chamber 202.

The one or more predetermined materials, for example, are associated with one or more processes performed on the workpiece 212 prior to the workpiece being placed in the chamber 202, whereby the one or more predetermined materials generally exhibit outgassing at the predetermined temperature. For example, the one or more materials may comprise photoresist materials or any other material formed, deposited, or otherwise present on the workpiece prior to being placed within the chamber 202.

Figure 5:
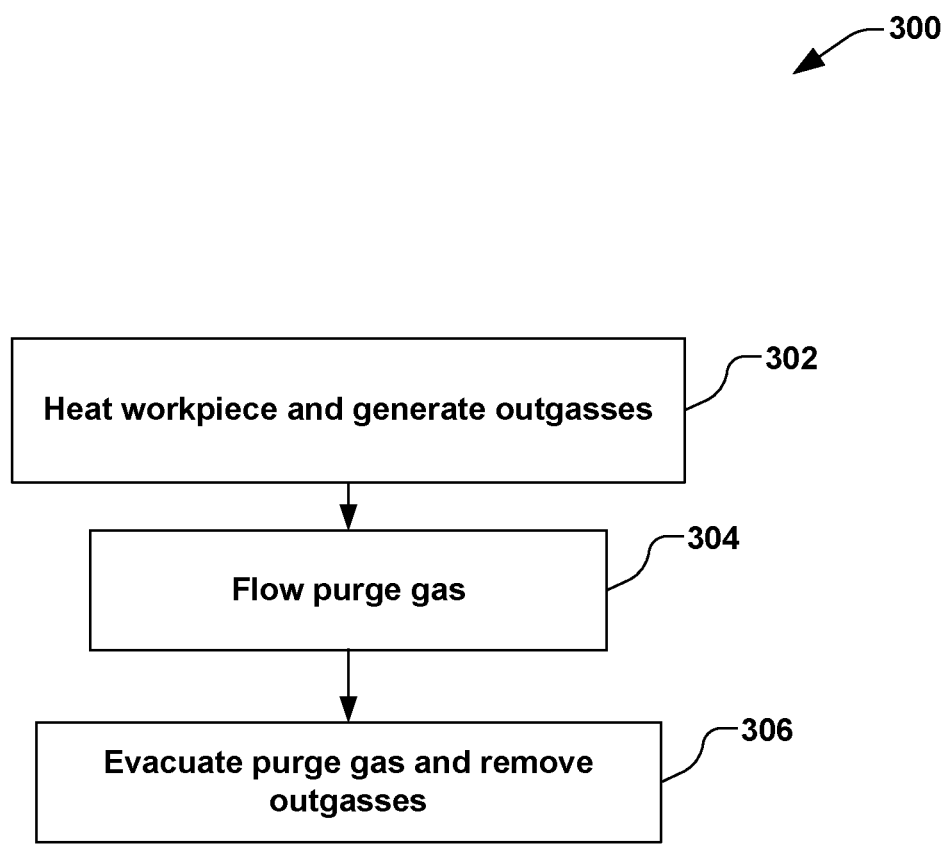
FIG. 5 is a block diagram illustrating an exemplary method for mitigating condensation of outgasses according to another exemplary aspect of the disclosure.

In another aspect of the disclosure, FIG. 5 illustrates a method 300 for controlling a temperature of a workpiece while mitigating condensation associated with outgassed materials. It should be noted that while exemplary methods are illustrated and described herein as a series of acts or events, it will be appreciated that the present disclosure is not limited by the illustrated ordering of such acts or events, as some steps may occur in different orders and/or concurrently with other steps apart from that shown and described herein, in accordance with the disclosure. In addition, not all illustrated steps may be required to implement a methodology in accordance with the present disclosure. Moreover, it will be appreciated that the methods may be implemented in association with the systems illustrated and described herein as well as in association with other systems not illustrated.

The method 300 shown in FIG. 5, for example, comprises heating the workpiece in a chamber in act 302, thereby generating an outgassed material. One or more chamber surfaces of the chamber generally define a chamber volume, for example, as described above. In act 304, a purge gas is flowed within the chamber volume at a predetermined pressure concurrent with the heating of the workpiece. Further, in act 306, the purge gas is evacuated from the chamber volume concurrent with the flowing of the purge gas, whereby the predetermined pressure is maintained, and wherein the outgassed material is generally evacuated from the chamber volume.

Figure 6:
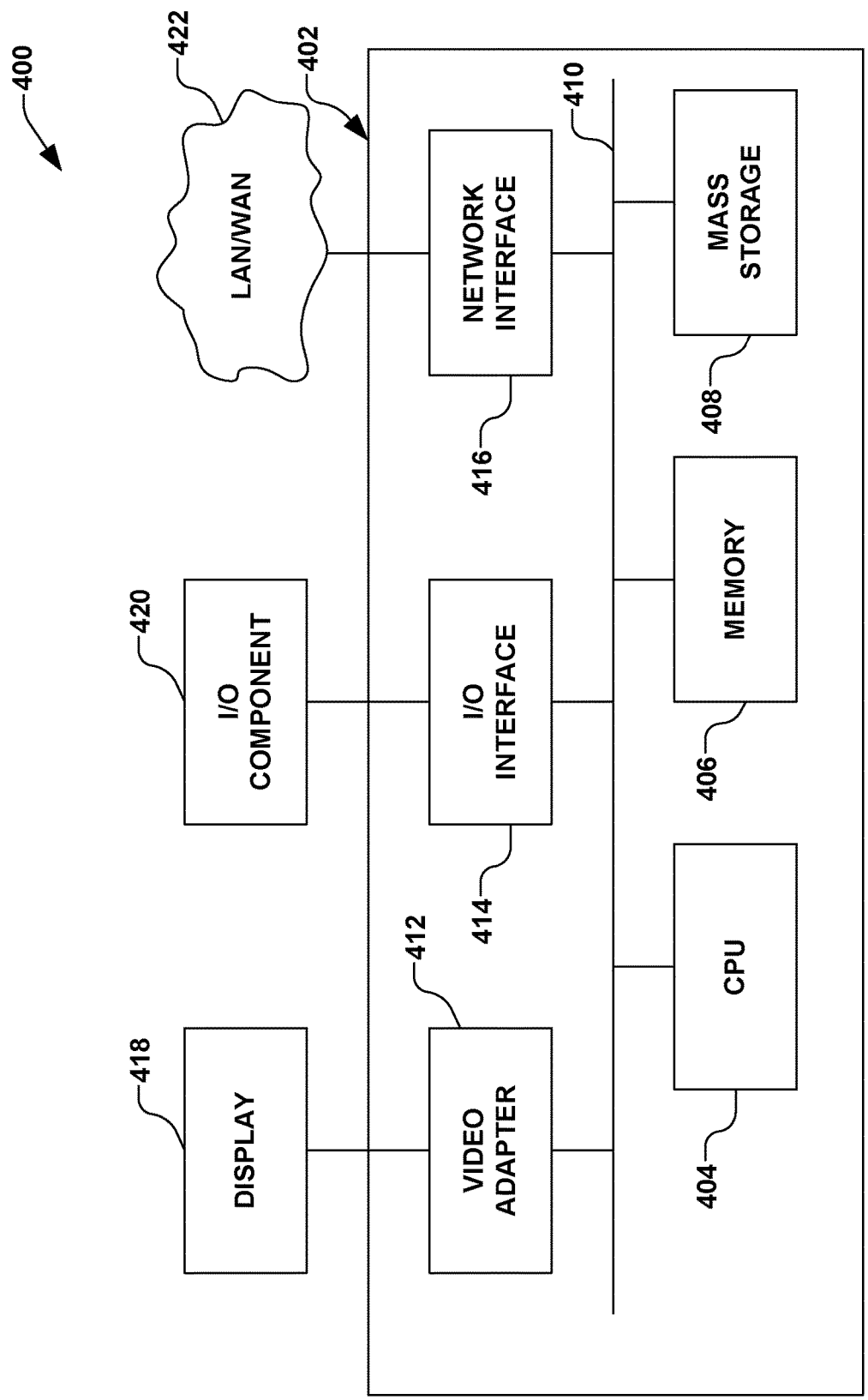
FIG. 6 is a block diagram illustrating an exemplary control system in accordance with another aspect.

In accordance with another aspect, the aforementioned methodology may be implemented using computer program code in one or more of a controller, general purpose computer, or processor based system. As illustrated in FIG. 6, a block diagram is provided of a processor based system 400 in accordance with another embodiment. The processor based system 400 is a general purpose computer platform and may be used to implement processes discussed herein. The processor based system 400 may include a processing unit 402, such as a desktop computer, a workstation, a laptop computer, or a dedicated unit customized for a particular application. The processor based system 400 may be equipped with a display 418 and one or more input/output devices 420, such as a mouse, a keyboard, or printer. The processing unit 402 may include a central processing unit (CPU) 404, memory 406, a mass storage device 408, a video adapter 412, and an I/O interface 414 connected to a bus 410.

The bus 410 may be one or more of any type of several bus architectures including a memory bus or memory controller, a peripheral bus, or video bus. The CPU 404 may include any type of electronic data processor, and the memory 406 may include any type of system memory, such as static random access memory (SRAM), dynamic random access memory (DRAM), or read-only memory (ROM).

The mass storage device 408 may include any type of storage device configured to store data, programs, and other information and to make the data, programs, and other information accessible via the bus 410. The mass storage device 408 may include, for example, one or more of a hard disk drive, a magnetic disk drive, or an optical disk drive.

The video adapter 412 and the I/O interface 414 provide interfaces to couple external input and output devices to the processing unit 402. Examples of input and output devices include the display 418 coupled to the video adapter 412 and the I/O device 420, such as a mouse, keyboard, printer, and the like, coupled to the I/O interface 414. Other devices may be coupled to the processing unit 402, and additional or fewer interface cards may be utilized. For example, a serial interface card (not shown) may be used to provide a serial interface for a printer. The processing unit 402 also may include a network interface 416 that may be a wired link to a local area network (LAN) or a wide area network (WAN) 422 and/or a wireless link.

It should be noted that the processor based system 400 may include other components. For example, the processor based system 400 may include power supplies, cables, a motherboard, removable storage media, cases, and the like. These other components, although not shown, are considered part of the processor based system 400.

Embodiments of the present disclosure may be implemented on the processor based system 400, such as by program code executed by the CPU 404. Various methods according to the above-described embodiments may be implemented by program code. Accordingly, explicit discussion herein is omitted. Further, it should be noted that various modules and devices in the Figures may be implemented on and controlled by one or more processor based systems 400 of FIG. 6. Communication between the different modules and devices may vary depending upon how the modules are implemented. If the modules are implemented on one processor based system 400, data may be saved in memory 406 or mass storage 408 between the execution of program code for different steps by the CPU 404. The data may then be provided by the CPU 404 accessing the memory 406 or mass storage 408 via bus 410 during the execution of a respective step. If modules are implemented on different processor based systems 400 or if data is to be provided from another storage system, such as a separate database, data can be provided between the systems 400 through I/O interface 414 or network interface 416. Similarly, data provided by the devices or stages may be input into one or more processor based system 400 by the I/O interface 414 or network interface 416. A person having ordinary skill in the art will readily understand other variations and modifications in implementing systems and methods that are contemplated within the scope of varying embodiments.

Although the disclosure has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the disclosure. In addition, while a particular feature of the disclosure may have been disclosed with respect to only one of several embodiments, such feature may be combined with one or more other features of the other embodiments as may be desired and advantageous for any given or particular application.

What is claimed is:

1. A workpiece processing system, comprising:
    a chamber having one or more chamber walls defining a respective one or more surfaces generally enclosing a chamber volume;
    one or more chamber wall heaters associated with the one or more chamber walls, wherein the one or more chamber wall heaters are configured to selectively heat the one or more chamber walls to a chamber wall temperature;
    a workpiece support positioned within the chamber and configured to selectively support a workpiece having one or more materials residing thereon, wherein each of the one or more materials has a respective condensation temperature associated therewith, above which, the one or more materials are respectively in a gaseous state;
    a heater apparatus configured to selectively heat the workpiece to a predetermined temperature; and
    a controller configured to heat the workpiece to the predetermined temperature via a control of the heater apparatus, thereby heating the one or more materials to respectively form one or more outgassed materials within the chamber volume, and wherein the controller is further configured to control the chamber wall temperature via a control of the one or more chamber wall heaters, wherein the chamber wall temperature is greater than a condensation temperature associated with the one or more outgassed materials, thereby preventing a condensation of the outgassed material on the one or more surfaces.

2. The workpiece processing system of claim 1, wherein the chamber wall temperature is determined based on an outgassing curve associated with the one or more materials.

3. The workpiece processing system of claim 1, wherein the one or more chamber wall heaters comprise one or more resistive heaters.

4. The workpiece processing system of claim 1, wherein the one or more chamber wall heaters comprise one or more of a heat lamp, an infrared heater, and a resistive heater.

5. The workpiece processing system of claim 1, further comprising:
    a first loadlock valve operably coupled to the chamber and configured to provide selective fluid communication between the chamber volume and a first environment, and wherein the first loadlock valve is further configured to selectively pass the workpiece between the chamber volume and the first environment; and
    a second loadlock valve operably coupled to the chamber and configured to provide selective fluid communication between the chamber volume and a second environment, and wherein the second loadlock valve is further configured to selectively pass the workpiece between the chamber volume and second environment.

6. The workpiece processing system of claim 5, wherein the controller is further configured to selectively open and close the first loadlock valve, thereby selectively isolating the chamber volume from the first environment, and wherein the controller is further configured to selectively open and close the second loadlock valve, thereby selectively isolating the chamber volume from the second environment.

7. The workpiece processing system of claim 6, wherein the chamber comprises a vacuum port and a purge gas port in fluid communication with the chamber volume, the workpiece processing system further comprising:
- a vacuum source;
- a vacuum valve configured to provide selective fluid communication between the vacuum source and the vacuum port;
- a purge gas source having a purge gas associated therewith; and
- a purge gas valve configured to provide selective fluid communication between the purge gas source and the purge gas port, wherein the vacuum valve and purge gas valve are configured to selectively flow the purge gas from the purge gas port to the vacuum port, and wherein the controller is further configured to control the vacuum valve and purge gas valve to selectively flow the purge gas from the purge gas port to the vacuum port at a predetermined pressure concurrent with heating of the workpiece, thereby generally evacuating the outgassed material from the chamber volume and preventing a condensation of the outgassed material on the one or more surfaces.

8. The workpiece processing system of claim 7, wherein the first environment comprises an atmospheric environment at atmospheric pressure, and wherein the second environment comprises a vacuum environment at a vacuum pressure, and wherein the controller is configured to flow the purge gas from the purge gas port to the vacuum port concurrent with the second loadlock valve isolating the chamber volume from the second environment.

9. The workpiece processing system of claim 8, wherein the controller is configured to flow the purge gas from the purge gas port to the vacuum port concurrent with the second loadlock valve isolating the chamber volume from the second environment and the first loadlock valve isolating the chamber volume from the first environment.

10. The workpiece processing system of claim 7, wherein the controller is configured to open the purge gas valve and vacuum valve concurrent with the heating of the workpiece, thereby further concurrently flowing the purge gas from the purge gas port to the vacuum port at the predetermined pressure.

11. The workpiece processing system of claim 10, wherein the purge gas valve comprises a purge gas regulator, and wherein the vacuum valve comprises a vacuum regulator, wherein the purge gas regulator and vacuum regulator are configured to provide the predetermined pressure when the purge gas is flowed from the purge gas port to the vacuum port.

12. The workpiece processing system of claim 11, wherein the controller is further configured to control one or more of the purge gas regulator and vacuum regulator, thereby controlling the predetermined pressure.

13. The workpiece processing system of claim 11, wherein one or more of the purge gas regulator and vacuum regulator comprise manual regulators.

14. The workpiece processing system of claim 1, further comprising a temperature measurement apparatus configured to determine a measured temperature of the workpiece, wherein the controller is further configured to control the one or more chamber wall heaters based, at least in part, on the measured temperature of the workpiece.

15. The workpiece processing system of claim 1, wherein the workpiece support comprises a heated platen having a support surface configured to contact a backside of the workpiece, wherein the heated platen generally defines the heater apparatus.

16. The workpiece processing system of claim 15, wherein the workpiece support comprise one or more pins configured to selectively raise and lower the workpiece onto a support surface associated therewith.

17. The workpiece processing system of claim 1, wherein the heater apparatus comprises one or more of a heat lamp, an infrared heater, and a resistive heater.

18. A loadlock apparatus, comprising:
- a chamber having one or more chamber walls defining a respective one or more surfaces generally enclosing a chamber volume, wherein the chamber comprises a vacuum port, a vacuum valve, a purge gas port, and a purge gas valve, wherein the vacuum port is in fluid communication with the chamber volume and the vacuum valve, and wherein the purge gas port is in fluid communication with chamber volume and the purge gas valve, wherein the vacuum port and purge gas port generally oppose one another;
- one or more chamber wall heaters associated with the one or more chamber walls, wherein the one or more chamber wall heaters are configured to selectively heat the one or more chamber walls to a chamber wall temperature;
- a workpiece support positioned within the chamber and configured to selectively support a workpiece having one or more materials residing thereon, wherein each of the one or more materials has a respective condensation temperature associated therewith, above which, the one or more materials are respectively in a gaseous state;
- a heated platen associated with the workpiece support, wherein the heated platen is configured to selectively heat the workpiece to a predetermined temperature wherein the heated platen is positioned between the vacuum port and purge gas port; and
- a controller configured to heat the workpiece to the predetermined temperature via a control of the heated platen, thereby heating the one or more materials to respectively form one or more outgassed materials within the chamber volume, and wherein the controller is further configured to control the chamber wall temperature via a control of the one or more chamber wall heaters, wherein the chamber wall temperature is greater than a condensation temperature associated with the one or more outgassed materials, thereby preventing a condensation of the outgassed material on the one or more surfaces, and wherein the controller is further configured to selectively flow of the purge gas across the heated platen via a control of one or more of the vacuum valve and purge gas valve.

19. A method for mitigating condensation of outgassing of a workpiece; the method comprising:
- heating the workpiece in a chamber having one or more chamber surfaces generally defining a chamber volume, thereby generating an outgassed material; and
- heating the one or more chamber surfaces to a predetermined temperature concurrent with the heating of the workpiece, wherein the predetermined temperature generally prevents the outgassed material from condensing on the one or more chamber surfaces.

20. The method of claim 19, wherein heating the one or more chamber surfaces comprises selectively activating one or more chamber wall heaters associated with the one or more chamber surfaces.

* * * * *